(12) United States Patent
Li et al.

(10) Patent No.: US 11,128,220 B2
(45) Date of Patent: Sep. 21, 2021

(54) SWITCHING MODE POWER SUPPLY CIRCUIT FOR THREE PHASE AC INPUT

(71) Applicant: SHANGHAI TUITUO TECHNOLOGY CO., LTD, Shanghai (CN)

(72) Inventors: Renhong Li, Shanghai (CN); Zhuo Shen, Shanghai (CN)

(73) Assignee: SHANGHAI TUITUO TECHNOLOGY CO., LTD, Shanghai (CN)

( * ) Notice: Subject to any disclaimer, the term of this patent is extended or adjusted under 35 U.S.C. 154(b) by 0 days.

(21) Appl. No.: 16/915,711

(22) Filed: Jun. 29, 2020

(65) Prior Publication Data

US 2020/0328683 A1    Oct. 15, 2020

Related U.S. Application Data

(63) Continuation of application No. PCT/CN2019/081712, filed on Apr. 8, 2019.

(30) Foreign Application Priority Data

Apr. 10, 2018 (CN) .......................... 201810317311.9

(51) Int. Cl.
*H02M 3/158*     (2006.01)
*G01R 19/175*    (2006.01)
(Continued)

(52) U.S. Cl.
CPC ........ *H02M 3/1584* (2013.01); *G01R 19/175* (2013.01); *H02M 1/4225* (2013.01);
(Continued)

(58) Field of Classification Search
CPC .... H02M 1/0009; H02M 1/0058; H02M 1/08; H02M 1/32; H02M 1/36; H02M 1/4225;
(Continued)

(56) References Cited

U.S. PATENT DOCUMENTS 9,816,737 B2 * 11/2017 Kamiya ................ H02M 7/217
10,498,224 B2 * 12/2019 Li ........................ H02M 1/4225
(Continued)

FOREIGN PATENT DOCUMENTS

CN          1551472 A    12/2004
CN        101136584 A     3/2008
(Continued)

*Primary Examiner* — Yemane Mehari
(74) *Attorney, Agent, or Firm* — Muncy, Geissler, Olds and Lowe, P.C.

(57) ABSTRACT

A SMPS circuit for three-phase AC input includes: a first input rectification circuit, a first capacitor, a feedback control and driving circuit, and multiple boost converter circuits. The first input rectification circuit rectifies input voltage and charges the first capacitor, forming a first loop. In each boost converter circuit, a second input rectification circuit rectifies input voltage and charges a second capacitor, forming a second loop; a first inductor, the second capacitor and a first switching component form a third loop in which rectified voltage on the second capacitor charges the first inductor. The first inductor, second capacitor, first capacitor and first output rectification circuit form a fourth loop in which induced voltage on first inductor and voltage on second capacitor are superimposed to charge first capacitor through the first output rectification circuit. The SMPS circuit provides high efficiency, high reliability, low EMI noise and good inrush inhibition capability.

10 Claims, 11 Drawing Sheets

(51) Int. Cl.
*H02M 1/42* (2007.01)
*H02M 1/44* (2007.01)
*H02M 7/219* (2006.01)
*H02M 1/32* (2007.01)
*H02M 1/00* (2006.01)

(52) U.S. Cl.
CPC ............. *H02M 1/44* (2013.01); *H02M 7/219* (2013.01); *H02M 1/0009* (2021.05); *H02M 1/0058* (2021.05); *H02M 1/32* (2013.01)

(58) Field of Classification Search
CPC ................. H02M 1/4233; H02M 1/44; H02M 3/156–158; H02M 3/1584; H02M 7/219; H02M 2001/0009; H02M 2001/0058
USPC ........ 323/234, 235, 265, 268, 271, 272, 282
See application file for complete search history.

(56) References Cited

U.S. PATENT DOCUMENTS

| | | | |
|---|---|---|---|
| 10,498,225 B2 * | 12/2019 | Li | H02M 1/4258 |
| 10,498,226 B2 * | 12/2019 | Li | H02M 3/33569 |
| 10,700,612 B2 * | 6/2020 | Li | H02M 1/083 |
| 2002/0145891 A1 * | 10/2002 | Ling | H02M 3/1588 |
| | | | 363/59 |
| 2014/0169051 A1 * | 6/2014 | Nakao | H02M 1/4225 |
| | | | 363/126 |
| 2016/0276924 A1 * | 9/2016 | Castelli | H02M 1/4225 |

FOREIGN PATENT DOCUMENTS

| | | |
|---|---|---|
| CN | 201091060 Y | 7/2008 |
| CN | 101394091 A | 3/2009 |
| CN | 108448888 A | 8/2018 |
| CN | 108494274 A | 9/2018 |
| TW | M346217 U | 12/2008 |

* cited by examiner

US 11,128,220 B2

SWITCHING MODE POWER SUPPLY CIRCUIT FOR THREE PHASE AC INPUT

CROSS-REFERENCE TO RELATED APPLICATION

This application is Continuation of International Patent Application No. PCT/CN2019/081712, filed on Apr. 8, 2019, entitled "SWITCH POWER SUPPLY CIRCUIT USED FOR THREE-PHASE INPUT" which claims priority of Chinese Patent Application No. 201810317311.9, filed on Apr. 10, 2018, and the entire disclosures of which are incorporated herein.

TECHNICAL FIELD

The invention relates to a high efficiency, simple and easy-control switching mode power supply (SMPS) circuit used for three phase input. The circuit can increase input voltage and convert it to output, and can achieve power factor correction (PFC) function in three-wire three-phase system.

BACKGROUND

Electrical equipment or appliance connected to AC power grid line should satisfy current harmonic standard IEC61000-3-2. To different equipment or application, IEC61000-3-2 defines their corresponding current harmonic limits, for example: Class A, Class B, Class C and Class D (see FIG. 1).

Current SMPS technology, to realize three-phase input power factor correction function, mainly uses three-phase Vienna PFC circuit (FIG. 2). In this circuit, power current passes through several rectification components and switching components, resulting in high loss and low efficiency. Furthermore, the control of three-phase Vienna PFC circuit involves the control of three bi-directional switchers according to input phases and requires a balance between voltages of two output capacitors, making it more difficult and complicated than traditional single phase boost type PFC circuit. As shown in FIG. 2, a three-phase full wave rectification circuit (consisted of D1, D2, D3, D4, D5 and D6) is embedded with three bi-directional switchers (Q1, Q2, Q3) and their surrounding diodes D7~D18. Inductors L1, L2 and L3 are boost inductors which are driven by the three bi-directional switchers to accomplish boost conversion to charge storage capacitors C1 and C2 at each positive and negative voltage of each input phase.

Above traditional three-phase PFC circuit is able to achieve high power factor to meet IEC6100-3-2 requirement, but it has below demerits:

1. In bi-directional switchers, current passes through two additional rectification components, which causes increased loss as compared to traditional boost circuit.

2. Need to control bi-directional switchers according to priority and phase of the three-phase input, and due to this complicated control process, MCU or DSP control has to be adopted.

3. Need to balance the voltages on storage capacitors C1 and C2 to prevent one of the capacitors from being reversely charged by the other one of the capacitors.

4. In practical design, in order to inhibit input inrush current at turn-on, at least two inrush current limiter circuits are required to be connected in series to the capacitors C1 and C2, resulting in increased loss and cost.

5. As boost inductors are connected to the AC input upstream to the rectification and boost circuit, switching noise of the boost inductors keep floating from ground of storage capacitors, leading to severe EMI problem.

SUMMARY OF THE INVENTION

The present invention is directed to solve the above disadvantages existed in conventional three-phase PFC SMPS circuits, and to provide an easy control, high efficiency, low EMI noise PFC SMPS circuit.

The object of the present invention is realized by below technical solution:

A switching mode power supply (SMPS) circuit used for three-phase AC input, comprising: a first input rectification circuit, a first capacitor, a boost feedback control and driving circuit, and at least one boost converter circuit, wherein:

the first input rectification circuit rectifies an input voltage and forms, together with the first capacitor, a first loop for charging the first capacitor;

each boost converter circuit converts one corresponding phase of the three-phase AC input, and each boost converter circuit at least includes: a second input rectification circuit, a second capacitor and a boost circuit, wherein the boost circuit includes a first inductor, a first switching component and a first output rectification circuit;

in each boost converter circuit, the second input rectification circuit rectifies the input voltage and forms, together with the second capacitor, a second loop for charging the second capacitor; when the first switching component conducts, the first inductor, the second capacitor and the first switching component form a third loop in which the second capacitor charges the first inductor; when the first switching component cuts off, the first inductor, the second capacitor, the first capacitor and the first output rectification circuit form a fourth loop in which an induced voltage on the first inductor is superimposed onto a voltage on the second capacitor to charge the first capacitor through the first output rectification circuit; the first capacitor, the second capacitor in each boost converter circuit, and the first input rectification circuit are coupled at terminals of a same polarity;

the first capacitor supplies energy to a load; and the boost feedback control and driving circuit outputs a chopping signal with a certain frequency and duty to turn on or turn off the first switching component in each boost circuit.

The operating principal of the present invention is described as below:

The first loop of the circuit only operates at the time that the power supply turns on, so as to charge the first capacitor which is a storage capacitor. In an EMC immunity test, the first loop also helps absorb pulse noise or lightning surge energy. After the boost converter circuit starts to work, the voltage on the first capacitor becomes higher than the input AC instant voltage, and the first loop no longer operates.

In the second loop of the circuit, due to the small capacitance value, the voltage on the second capacitor reflects the instant voltage in one of the three phases of the AC input voltage.

Each of the boost converter circuits converts the voltage of one corresponding phase. Conversion is accomplished by first switching component, second capacitor, first inductor, first capacitor and first rectification circuit. When first switching component turns on, first inductor is charged by rectified instant AC input voltage on second capacitor; when first switching component turns off, induced voltage on first inductor and rectified instant AC input voltage on second capacitor are superimposed to charge first capacitor. Therefore, voltage on first capacitor is always higher than input AC instant voltage, so that boost conversion is accomplished.

Operating duty of each first switching component is driven by the boost feedback control and driving circuit to obtain regulated output of first capacitor.

The advantage of the present invention lies in:

The three-phase SMPS circuit of the present invention provides a high efficiency, low cost, good EMC solution for three-phase boost type active PFC circuit.

The first output rectification circuit in the present invention does not belong to the first loop that charges the first capacitor, so there will be no power-on inrush current passing through it, and the circuit has strong immunity to input inrush or lightning surge. In addition, as the first inductor does not belong to the first loop either, by-pass diode is not required to prevent first inductor from saturation caused by input inrush current.

During SMPS operation, the first loop is in an off state and its rectification component connecting to a negative terminal of the first capacitor is always reversely biased, which makes common-mode noise from downstream DC-DC converter exhibit high impedance to the input power grid. The common mode noise from DC-DC converter flows to input power grid only through common path of the first loop and second loop. Furthermore, differential mode noise from DC-DC converter cannot form a loop to transmit the noise to the input power grid because the first loop is cut off, so that it also exhibits high impedance to the input power grid with regard to the noise transmission. As a result, the SMPS circuit of the present invention effectively reduces EMI noise and its countermeasure cost during development. By adopting soft switching technique in the present invention, high frequency noise emission can also be alleviated.

According to an embodiment, three boost converter circuits work in parallel. Unlike several series-connected rectification components in the conventional three-phase Vienna PFC circuit which causes more loss, the present invention can achieve a conversion and reliability same as a single-phase boost converter. The three boost converter circuits of the present invention act as three single phase boost converter circuits, which eases the solution of addressed EMI noise issues.

DETAILED DESCRIPTION OF EXEMPLARY EMBODIMENTS

The present invention will be further described in the following embodiments in combination with the illustrated figures.

In order to better understand the operation principle of the switching power supply circuit of the present invention, in the following embodiments, components in the circuit are divided into sub-circuits according to their functions. Different sub-circuits may share the same component(s) and shall not cause any misunderstanding.

First Embodiment

Figures 1, 2:
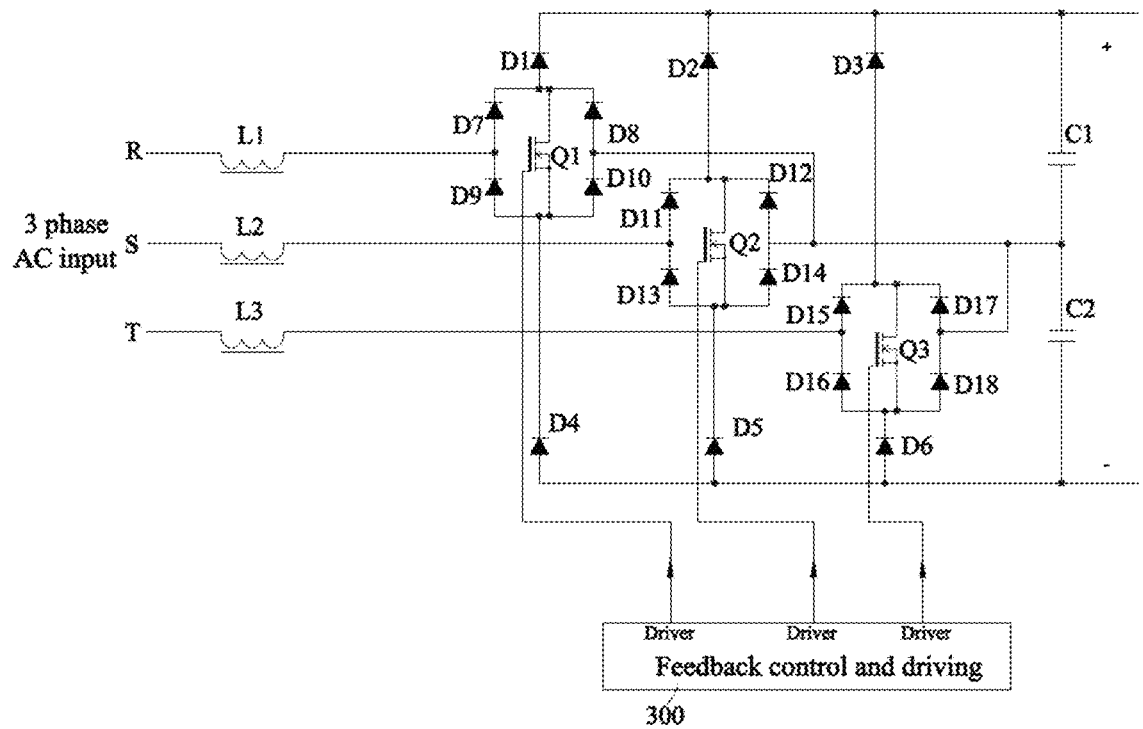
FIG. 1 is an exemplary diagram showing requirements for IEC61000-3-2.
FIG. 2 is a conventional SMPS circuit for three-phase PFC circuit.
Figure 3:
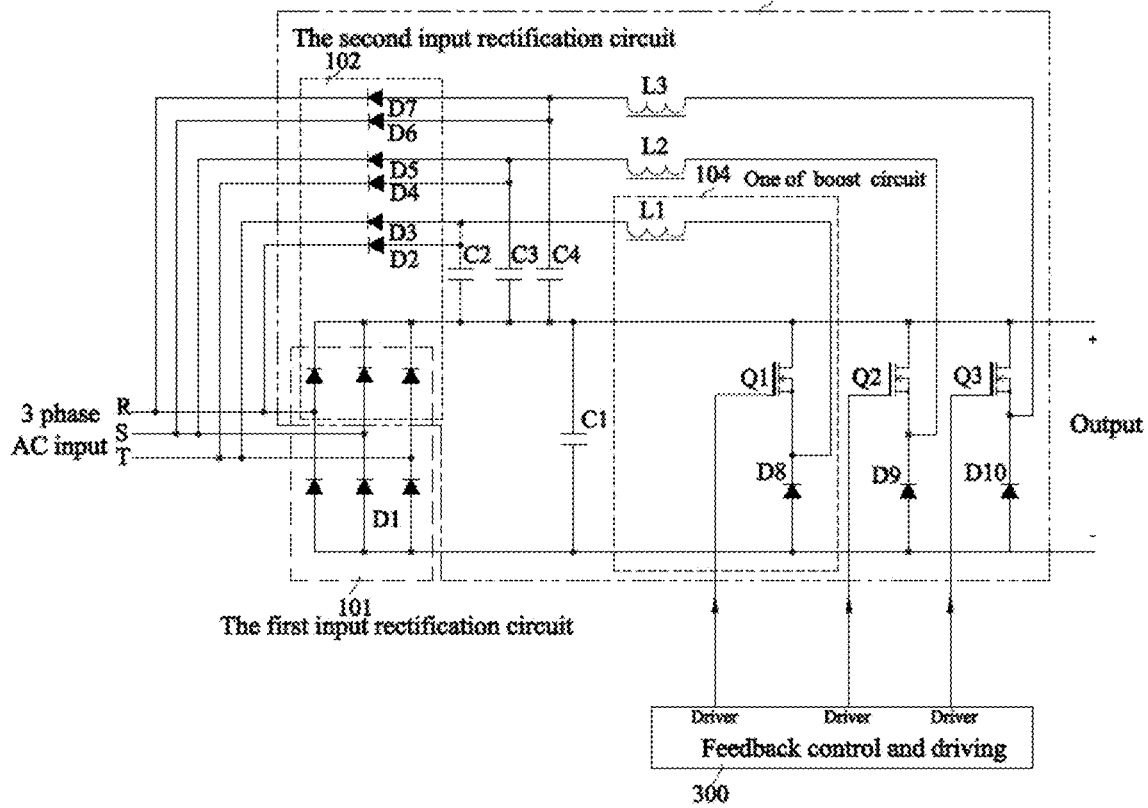
FIG. 3 is a schematic block diagram of the first embodiment.

The first embodiment of three-phase input SMPS as shown in FIG. 3 comprises a first rectification circuit 101, a first capacitor C1, a boost feedback control and driving circuit 300, and a three-phase boost converter circuit 103 which includes at least one boost converter circuit. Each Boost converter circuit converts voltage of one corresponding phase of a three-phase input. In the embodiment, three identical boost converter circuits are adopted and each of the boost converter circuits connects to two corresponding poles of the three-phase input. According to this embodiment, a first boost converter circuit connects to poles R and T, a second boost converter circuit connects to poles S and T, and a third boost converter circuit connects to poles R and S. Other boost converter circuit provided in different connection to achieve the same function is also accepted.

In this embodiment, first input rectification circuit 101 is implemented as a bridge diode D1 consisting of six diodes. First input rectification circuit 101 rectifies an input voltage of the three-phase input and charges first capacitor C1 to form a first loop.

Each boost converter circuit comprises: second input rectification circuit 102, second capacitor (C2 or C3 or C4), first inductor (L1 or L2 or L3), first switching component (Q1 or Q2 or Q3) and first output rectification circuit (D8 or D9 or D10), wherein first inductor (L1 or L2 or L3), first switching component (Q1 or Q2 or Q3) and first output rectification circuit (D8 or D9 or D10) constitute a boost circuit 104. The second input rectification circuit 102 of each boost converter circuit comprises rectification components (D2 and D3; or D4 and D5; or D6 and D7) and a corresponding part of the first input rectification circuit 101 (i.e. the corresponding diodes in the bridge diode D1 that are connected to the rectification components).

In each boost converter circuit, the second input rectification circuit 102 charges second capacitor (C2 or C3 or C4) to form a second loop. First capacitor C1, second capacitor (C2 or C3 or C4), and first input rectification circuit's output are coupled at the same voltage polarity. FIG. 3 is an example of these components coupling at their positive terminals.

Figure 4A:
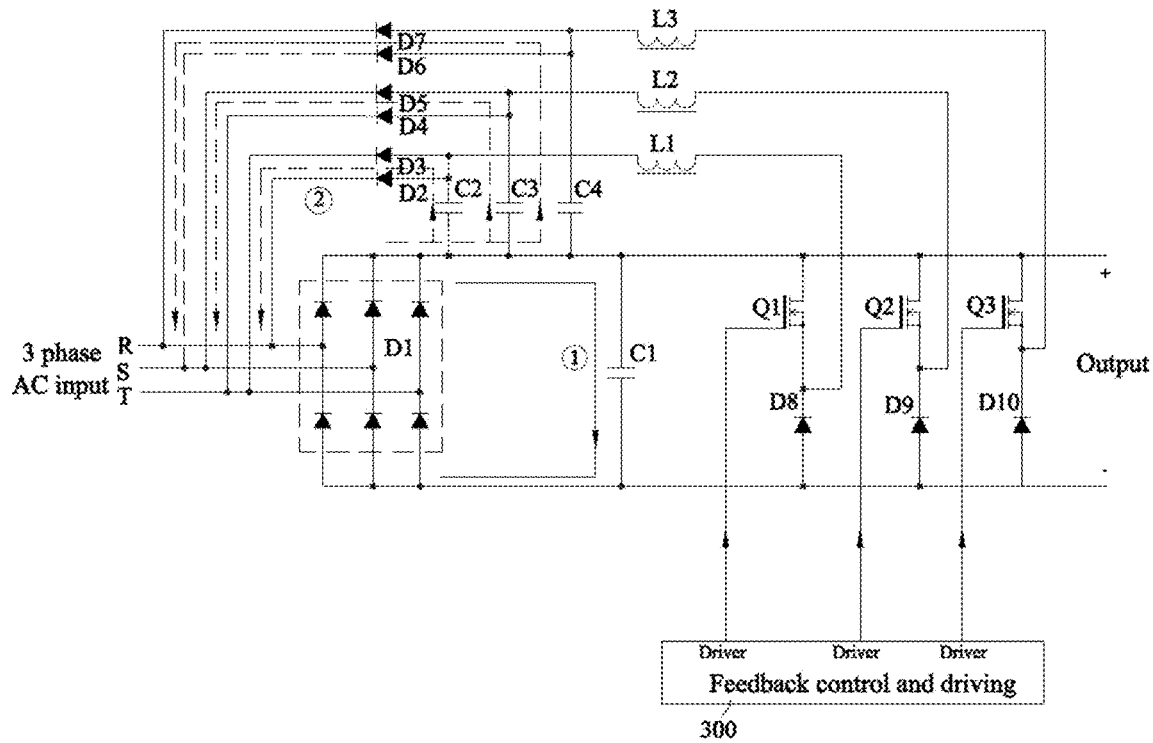
FIG. 4A shows the first loop and second loop in the first embodiment.
Figure 4B:
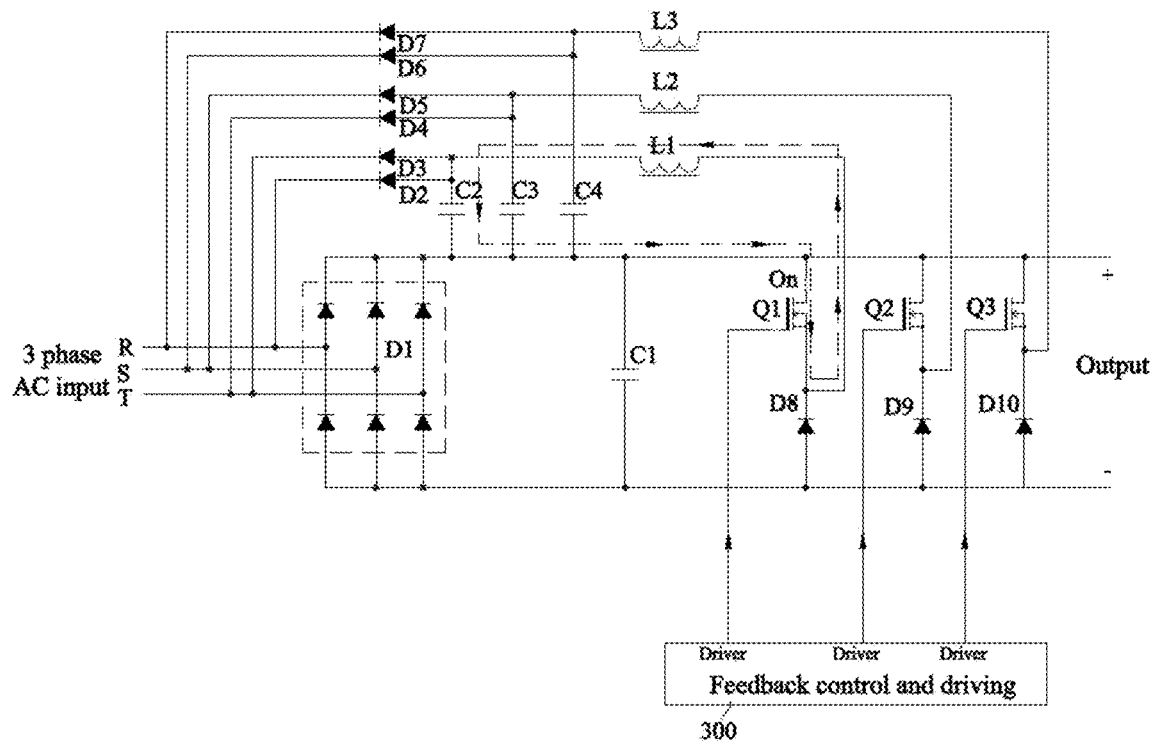
FIG. 4B shows the third loop in the first embodiment.
Figure 4C:
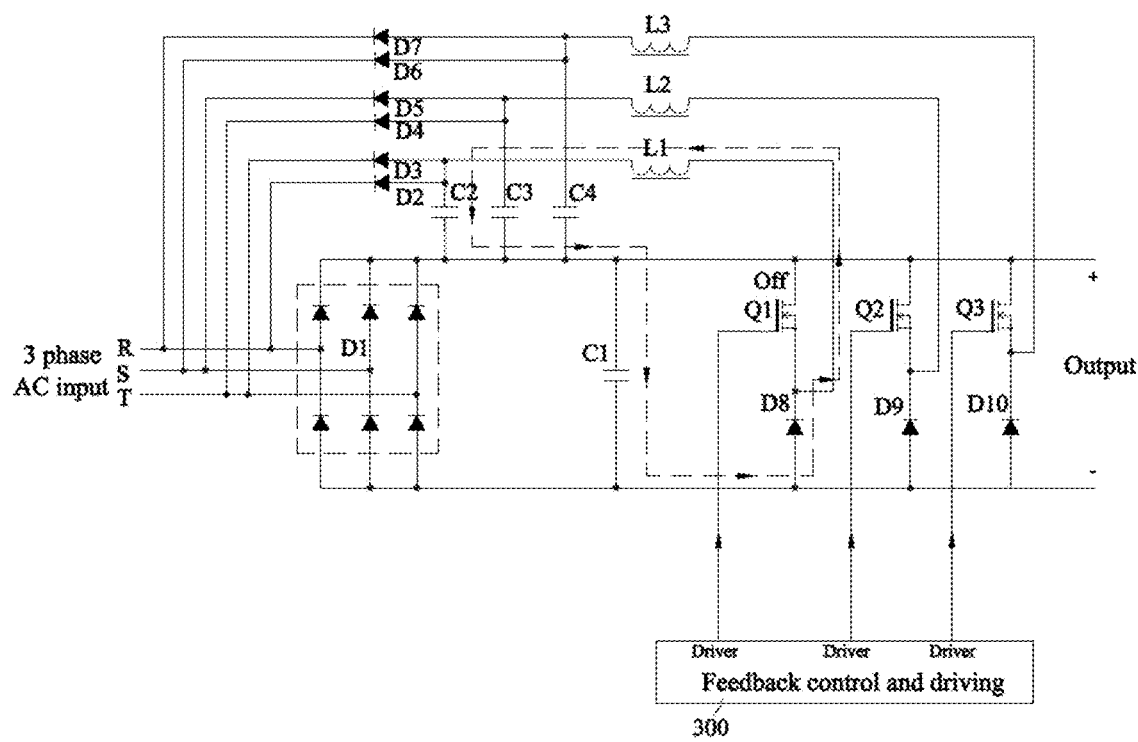
FIG. 4C shows the fourth loop in the first embodiment.

In each boost circuit 104, when first switching component Q1 conducts, first inductor L1, second capacitor C2 and first switching component Q1 form a third loop in which input rectified voltage on the second capacitor C2 charges first inductor L1, referring to FIG. 4B; when first switching component Q1 is off, first inductor L1, second capacitor C2, first capacitor C1 and first output rectification circuit D8 form a fourth loop in which induced voltage on first inductor L1 and voltage on second capacitor C2 accumulate to charge first capacitor C1 through the first output rectification circuit D8, referring to FIG. 4C.

The first capacitor C1 supplies energy to load.

The boost feedback control and driving circuit 300 outputs chopping signal to drive the first switching component (Q1, Q2, Q3) in each boost circuit with certain frequency and duty that are determined by feedback control and driving circuit 300.

For better understanding, first input rectification circuit 101, second rectification circuit 102 and first output rectification circuit (D8, D9 or D10) are chosen as bridge diode or diodes. Other type of components which are able to perform the same rectification function also can be used. First input rectification circuit 101 is bridge diode D1. In the first boost converter circuit, part of the bridge diode D1, and diodes D2, D3 constitute the second input rectification circuit 102; C2 is the second capacitor, L1 is the first inductor, Q1 is the first switching component, diode D8 is the first output rectification circuit. In the second boost converter circuit, another part of the bridge diode D1, and diodes D4, D5 constitute the second input rectification circuit 102; C3 is the second capacitor, L2 is the first inductor, Q2 is the first switching component, diode D9 is the first output rectification circuit. In the third boost converter circuit, a further part of the bridge diode D1, and diodes D6, D7 constitute the second input rectification circuit 102; C4 is the second capacitor, L3 is the first inductor, Q3 is the first switching component, diode D10 is the first output rectification circuit.

Operation of the first boost converter circuit is described as below, and the other boost converter circuits are identical to the first one in structure and therefore convert the voltage of their corresponding phase of the three-phase input in a similar way as the first boost converter circuit.

The SMPS circuit as mentioned includes two portions:

First portion: two input rectification circuits as shown in FIG. 4A.

Referring to first loop ① shown in FIG. 4A, the first input rectification circuit includes first rectification component D1, which rectifies input voltage in full wave mode, and stores energy in first capacitor C1. When boost circuit operates after power supply's turn-on, boost output voltage on C1 is always higher than instant voltage of AC input, thus AC input no longer charges C1. When boost output power is insufficient to maintain C1's voltage higher than the instant AC voltage, AC input starts to charge C1 again.

Referring to second loop ② shown in FIG. 4A, the second input rectification circuit includes first input rectification component D1 and other input rectification components D3, D4. The second input rectification circuit charges second capacitor C2. Due to relatively small capacitance of C2, voltage on C2 reflects full wave rectification waveform of input AC. In active PFC (boost) circuit, C2 serves as a boost capacitor for high frequency noise reduction and improvement of EMI.

Second portion: boost conversion as shown in FIG. 4B and FIG. 4C.

In the embodiment, first inductor L1 is able to operate in either discontinuous current mode (DCM) or continuous current mode (CCM), and first switching component operates at hard switching mode.

Operation principle (illustrating operation of the first boost converter circuit as an example):

1) State 1: First switching component Q1 conducts, as shown in FIG. 4B.

Initial voltage on the first capacitor C1 is rectified input voltage at power supply turn-on, and afterwards the voltage of C1 becomes boost conversion's output voltage which is used to supply energy to load. Voltage on second capacitor C2 reflects the instant AC voltage after rectification.

When voltage on C2 generates a current that flows into first inductor L1 through Q1 as indicated by dotted line in FIG. 4B, boost energy is stored in the L1.

2) State 2: First switching component Q1 cuts off, as shown in FIG. 4C.

When Q1 is off, the energy stored in L1 induces voltage and accumulates with voltage on C2, to cooperatively charge first capacitor C1 though D4, and thereby boost conversion operates (indicated by dotted line).

In case when L1 enters state 1 of the next cycle, the stored energy in L1 has not been fully released, L1 will operate in CCM. In case L1 has fully released the stored energy before the next state 1 starts, its current returns to zero, and then L1 operates in DCM.

As such, state 1 and state 2 are repeated to maintain continuous boost conversion.

In the first boost converter circuit, first inductor L1 and second capacitor C2 absorb energy from AC input by operating according to changes in voltage and phase of AC during switching on and switching off of Q1, to make input AC current synchronous with input AC voltage. As a result, power factor correction function is achieved. The other boost converter circuits operate in the same manner as the first one. They can co-operate in the mode of synchronization which is simple, or co-operate in the mode of phase-shift, which reduces output ripple and balances components' heat dissipation.

Boost feedback control and driving circuit 300 can be realized by hardware, for example, it may comprise an automatic control circuit consisted of a sensing circuit, a reference circuit and an operational amplifier, and may further comprise a comparator and a triangle waveform generator to output chopping driving signal based on the result of automatic control circuit. Boost feedback control and driving circuit 300 can also be realized by software, for example, software MCU or DSP can be programmed to generate chopping driving signal. Actual applications of feedback control may include constant voltage (CV), constant current (CC) and constant power (CP) control.

What is noteworthy is that the magnet reset condition for each first inductor L1, L2 or L3 is Vin·Duty=(Vdc−Vin)·(1−Duty). To ensure complete magnetic reset, maximum duty can be derived as below:

$$Duty(max)=(Vdc-Vin)/Vdc$$

Vin: Instant AC input voltage

Vdc: Boost converter circuit's output voltage, namely the voltage on first capacitor C1

When Vin is at its sinusoidal peak whose value is very close to Vdc, Duty(max) must be small enough to maintain first inductor's "Voltage·Time" in balance to ensure the magnetic reset. If boost converter circuit's duty is higher than Duty(max), first inductor would saturate, leading to damage of the first switching component.

Below method could be used to prevent first inductor from saturation:

Boost feedback control and driving circuit 300 monitors both Vin and Vdc to calculate Duty(max) to limit operating duty. Actual operating duty is selected as a minimum of setting duty determined by feedback loop and maximum duty Duty(max).

Second Embodiment

Figure 5:
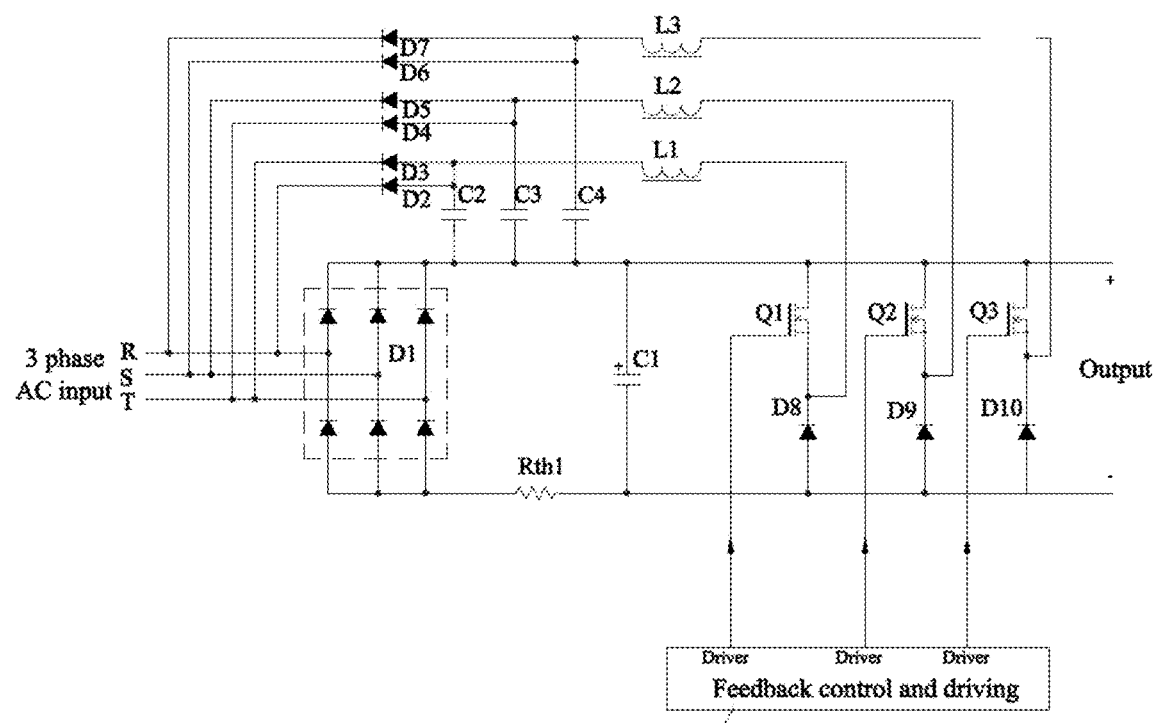
FIG. 5 is a schematic diagram of the second embodiment.

As shown in FIG. 5, the difference of second embodiment compared to the first embodiment lies in: an inrush current limiting circuit Rth1 coupled in series to the first loop. The inrush current limiting circuit Rth1 belongs to the first loop, but does not belong to any of the second loop the third loop or the fourth loop. Since the first loop only works at power supply's startup, the inrush current limit circuit has no loss during power supply's normal operation. Benefitting from this, Rth1 can be chosen as a normal resistor with high value to be able to withstand and effectively reduce inrush current, without sacrificing efficiency. Tradeoff between low inrush current and startup capability in traditional design is no longer required. Well-designed inrush current limiting circuit with a combination of resistor, capacitor and inductor could improve EMC surge and noise immunity. By taking advantage of the dual rectification input structure, the inrush current limiting circuit obtains high efficiency and low cost advantages comparing to thermistor or relay circuit used in traditional Boost circuit of AC-DC.

The operating principle of the second embodiment is same as the first one.

Third Embodiment

Figure 6:
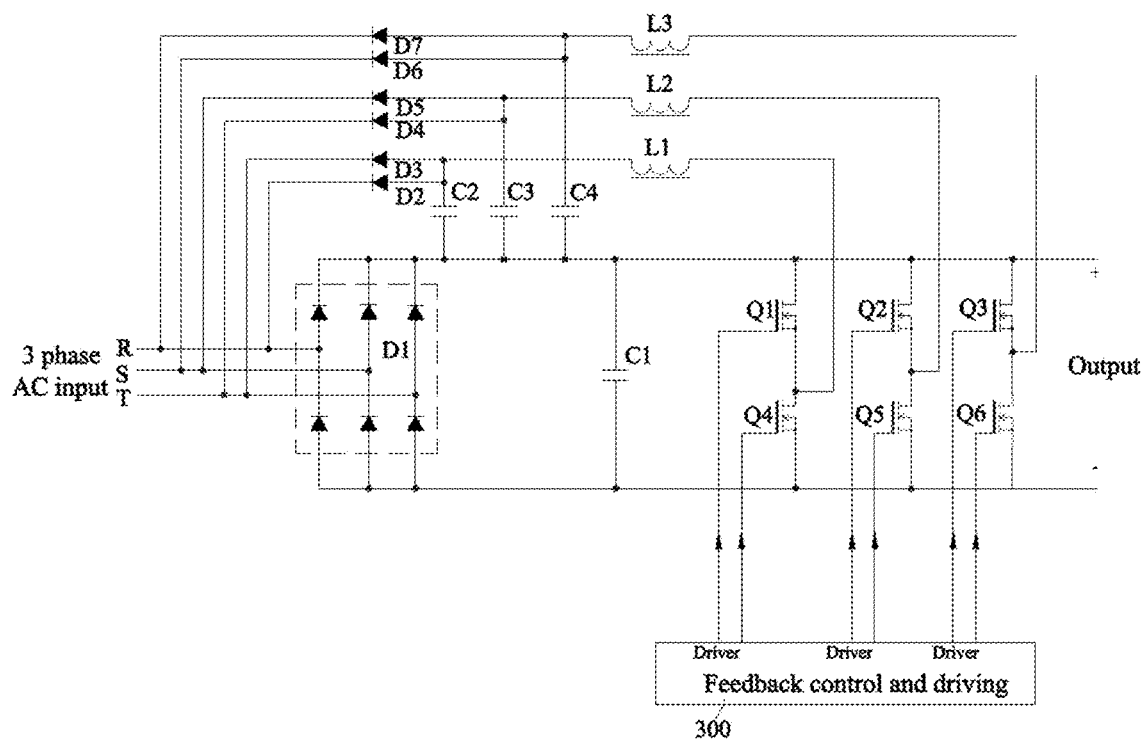
FIG. 6 is a schematic diagram of the third embodiment.

In the third embodiment, the first output rectification circuit in each boost circuit in the above first and second embodiments is replaced by a switching component (Q4, Q5 or Q6), as shown in FIG. 6. Switching component Q4 acts as a second switching component in the first boost circuit, Q5 acts as a second switching component in the second boost circuit, and Q6 acts as a second switching component in the third boost circuit. Switching mode of the second switching components are controlled by boost feedback control and driving circuit 300. In this embodiment, both first switching component and second switching component can be designed to operate in soft switching mode, or called zero voltage switching (ZVS) mode.

In this embodiment, if first inductor operates in CCM, then first switching component operates in hard switching mode whose operating principle is same as first embodiment. Second switching component acts as boost synchronous rectification component.

If first inductor operates in DCM or deliberately designed in DCM, after first inductor's current returns to zero, voltage on C1 charges resonant tank containing second capacitor and first inductor. By controlling switch-off of second switching component, resonant current is forced to pass through body diode of first switching component, and at the same time discharges its parasitic capacitor, enabling the first switching component to achieve zero voltage switching at its next switching-on.

Detailed operating principle of soft switching is described as below: (Example based on first boost converter circuit in FIG. 7A, FIG. 7B, FIG. 7C, FIG. 7D, and FIG. 7E)

Figure 7A:
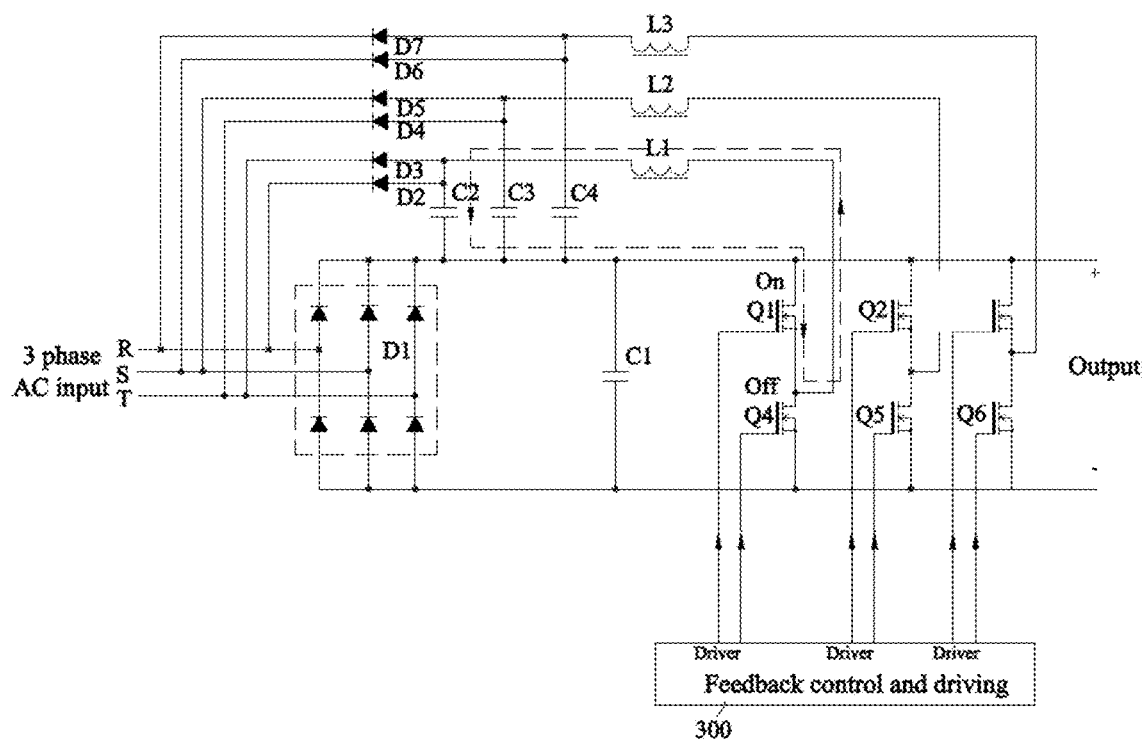
FIG. 7A shows the current loop of operating state 1 in the third embodiment.

1) State 1: First switching component Q1 is on, second switching component Q4 is off, as shown in FIG. 7A.

Initial voltage on the first capacitor C1 is rectified input voltage at power supply's turn-on, and afterwards the voltage on C1 becomes boost conversion's output voltage and provides energy to load. Voltage on second capacitor C2 reflects instant AC voltage after rectification.

When voltage on C2 generates a current that flows into the first inductor L1 through Q1 as indicated by dotted line, boost energy is stored in the L1.

Figure 7B:
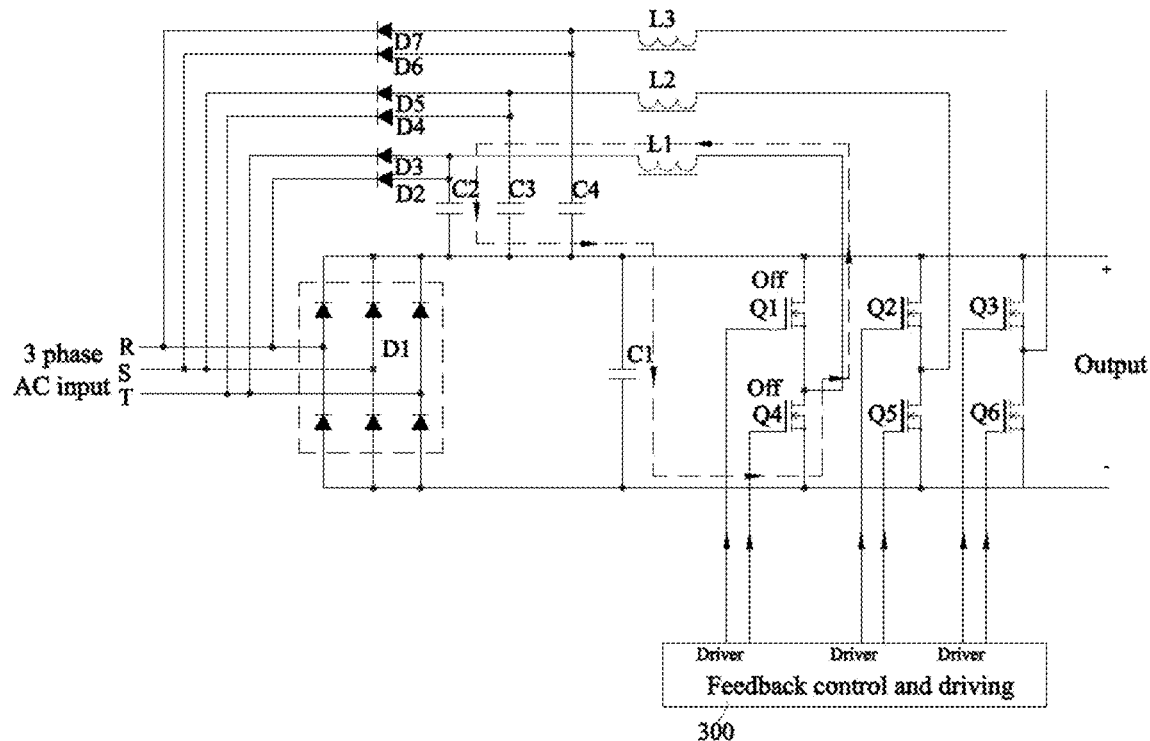
FIG. 7B shows the current loop of operating state 2 in the third embodiment.

2) State 2: First switching component Q1 is turned off, second switching component Q4 remains turn-off, as shown in FIG. 7B.

When Q1 switches off, the energy stored in L1 induces voltage and accumulates with voltage on C2, to cooperatively charge first capacitor C1 through body diode of Q4, and thereby boost conversion operates (indicated by dotted line). The boosted charging current, at the same time, discharges parasitic capacitor of Q4, making it ready for the next zero voltage switching-on.

Figure 7C:
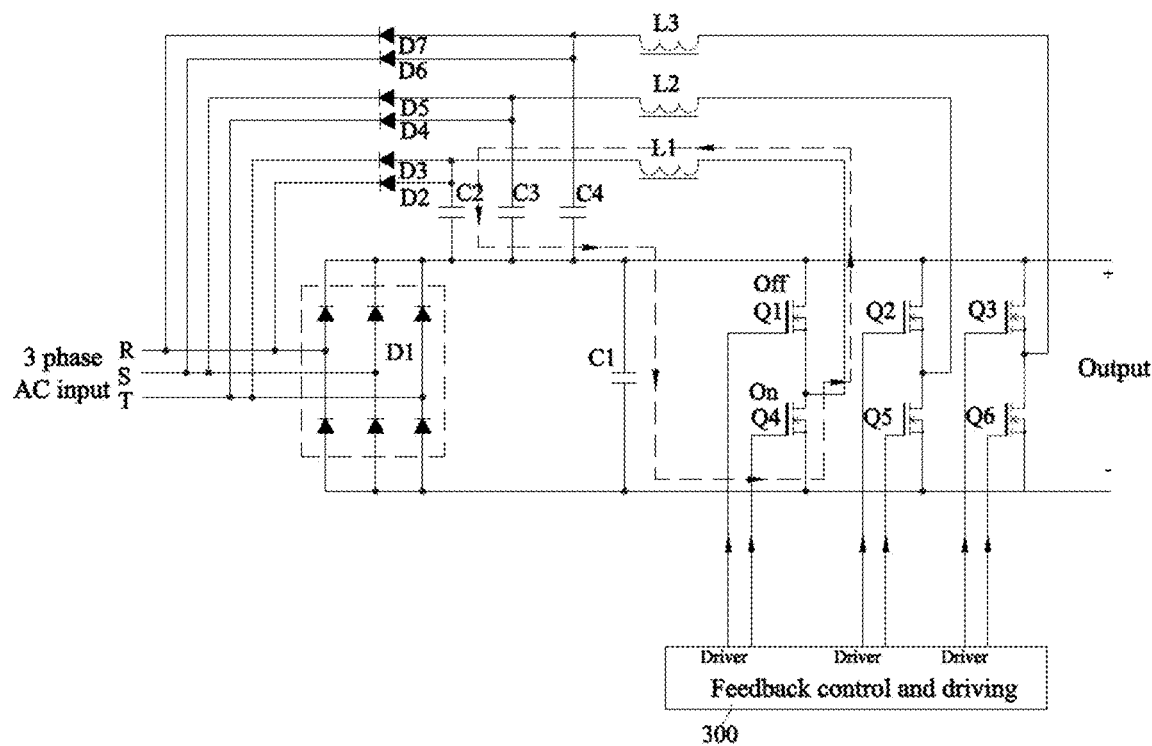
FIG. 7C shows the current loop of operating state 3-1 in the third embodiment.

State 3-1: First switching component Q1 remains off, second switching component Q4 switches on, as shown in FIG. 7C.

First inductor L1 continues releasing energy, and its voltage accumulates with voltage on C2 to continue charging C1 through second switching component Q4 which is now in an on state. Thanks to zero switching and low conducting resistance, this embodiment is able to effectively improve the efficiency compared to first and second embodiments by using switching component instead of rectification component.

Figure 7D:
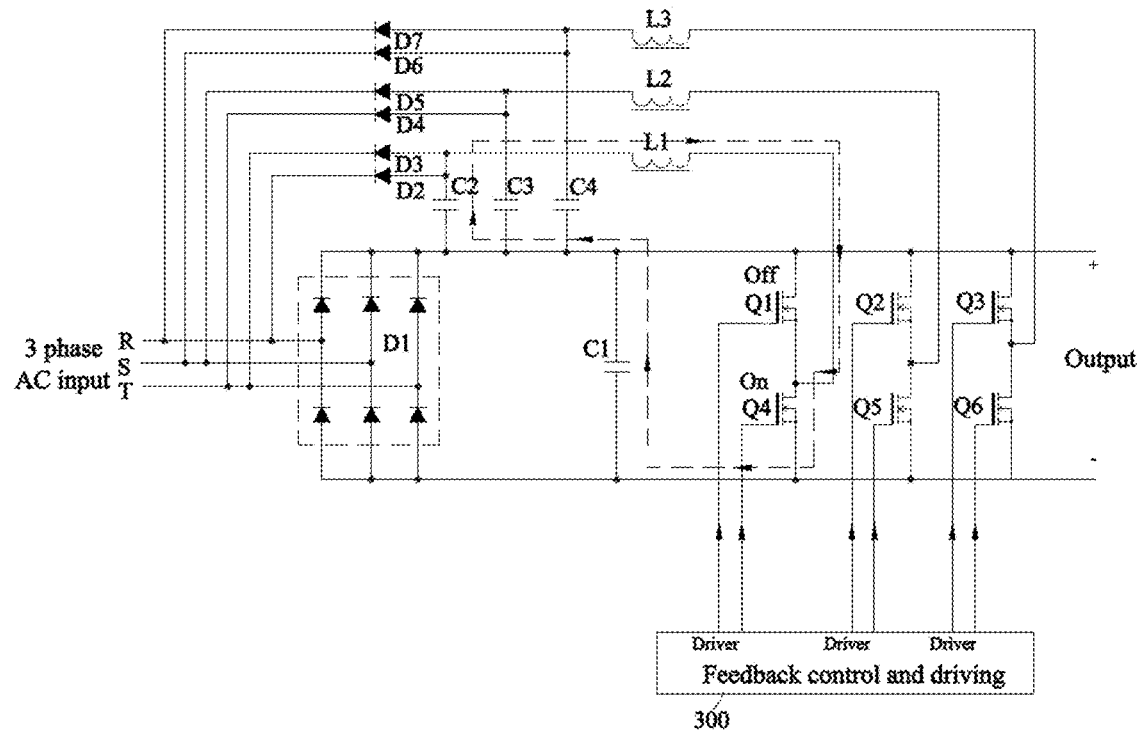
FIG. 7D shows the current loop of operating state 3-2 in the third embodiment.

3) State 3-2: First switching component Q1 remains off, second switching component Q4 remains on, as shown in FIG. 7D.

After energy in L1 is fully released, boost converter circuit's current decreases to zero, and then voltage on C1, conducted by Q4, starts to charge resonant tank of L1 and C2.

Figure 7E:
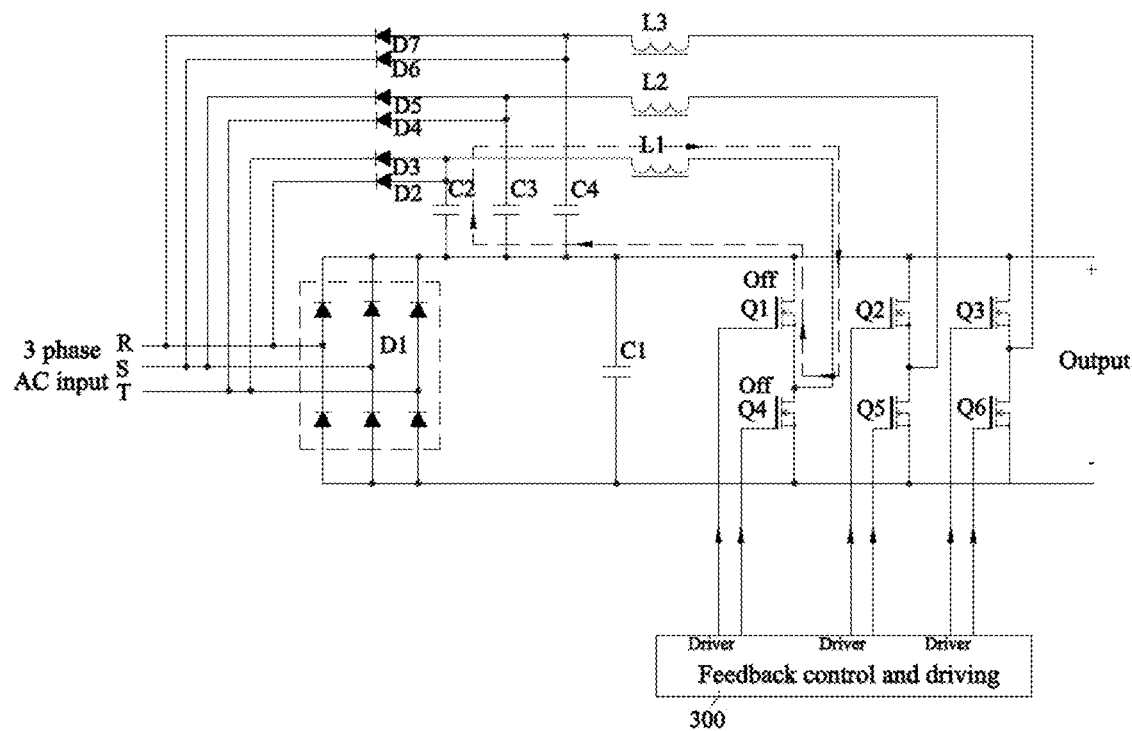
FIG. 7E shows the current loop of operating state 3-2 in the third embodiment.

4) State 4: First switching component Q1 remains off, second switching component Q4 turns off, as shown in FIG. 7E.

The switching-off of Q4 forces resonant current change direction to go through body diode of Q1, and at the same time discharges parasitic capacitor of Q1, making it ready for the next zero voltage switching-on.

Design the first inductor L1 to operate in DCM, and use boost feedback control and driving circuit 300 to detect zero return of L1's current. Adjust resonant current to discharge parasitic capacitor of Q1 by controlling the time of switching-off of Q4. As a result, the speed of discharging parasitic capacitor of Q1 can be controlled, allowing Q1's next switch-on to be close to a zero voltage switch-on.

Repeat the process from state 1 to state 4 to accomplish continuous resonant boost conversion.

Three boost converter circuits operate in the same way to convert voltage of the respective three phases. The three boost converter circuits can co-operate in the mode of synchronization which is simple, or co-operate in the mode of phase-shift which can reduce output ripple and balance components' heat dissipation.

Figure 8A:
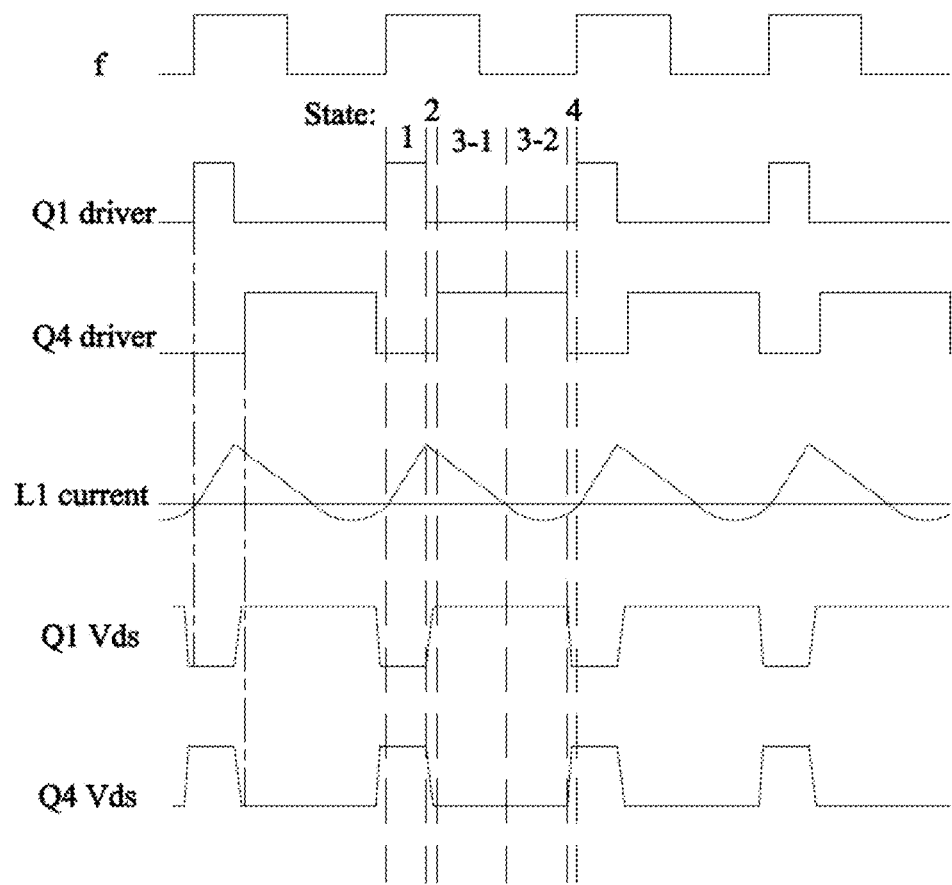
FIG. 8A is the operating waveform of the third embodiment in condition one.

FIG. 8A illustrates operating waveform of the embodiment. Parasitic capacitors of Q1 and Q4 are discharged by resonant current as described above. Both Q1 and Q4 operate in ZVS mode.

Figure 8B:
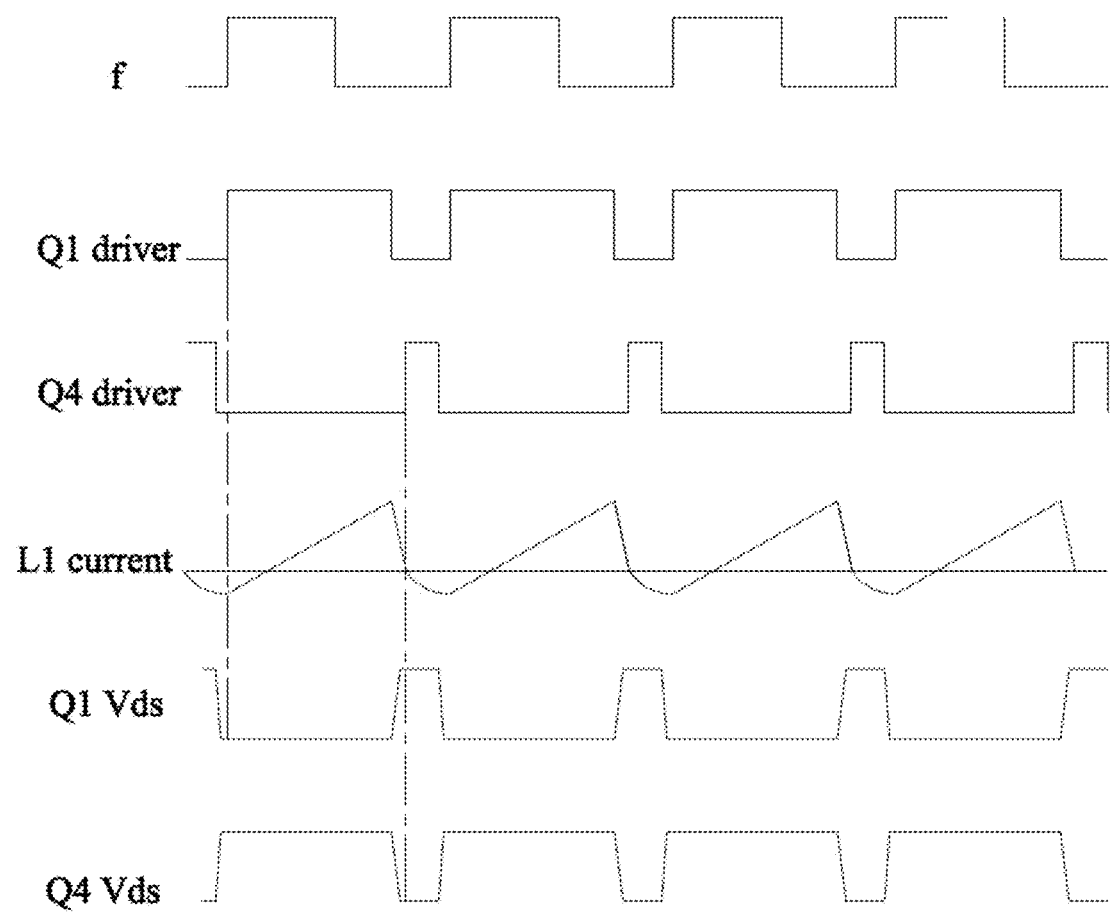
FIG. 8B is the operating waveform of the third embodiment in condition two.

In order to prevent first inductor and second capacitor's resonant current enter capacitive region (reverse), mandatory maximum duty operation is required when AC input is at its low level. FIG. 8B illustrates the operating waveform in mandatory maximum duty condition. The mandatory maximum duty can be dynamically set according to AC input or load condition.

Figure 8C:
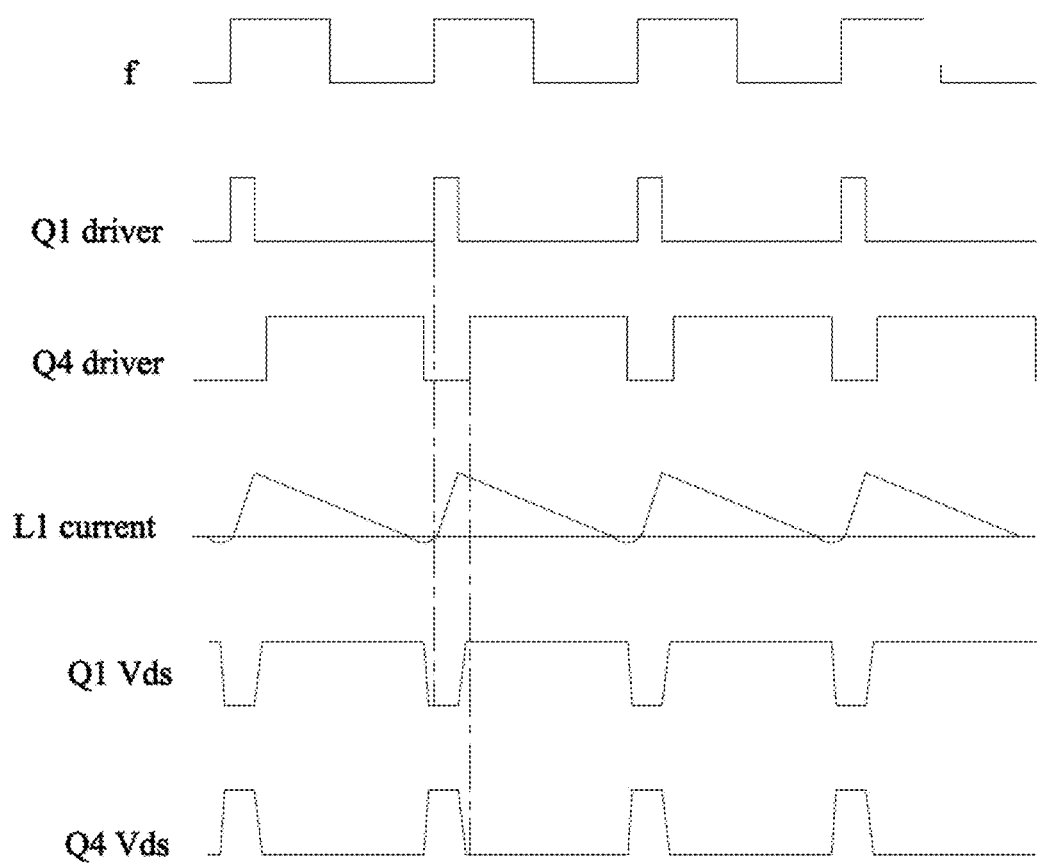
FIG. 8C is the operating waveform of the third embodiment in condition three.

Same as the description in the first embodiment, at high AC instant voltage condition, Duty(max) shall be limited to prevent saturation of first inductor. FIG. 8C illustrates the operating waveform under limited Duty(max) condition.

In this embodiment, by using switching components with low impedance as the first output rectification circuit, it not only reduces conduction loss, but also reduces switching loss by attaining ZVS at DCM, in such a way, resulting in efficiency improvement and noise reduction. Further, in addition to the ZVS operation described above, by using switching components to replace diodes in input rectification circuit as to be described in the fourth embodiment below, the topology can be even better than bridgeless PFC circuits in terms of efficiency and EMI noise.

Based on the description of first output rectification circuit in first embodiment, any alternative substitutions to the first output rectification circuit shall be considered as under the scope of the present invention.

Fourth Embodiment

Figure 9:
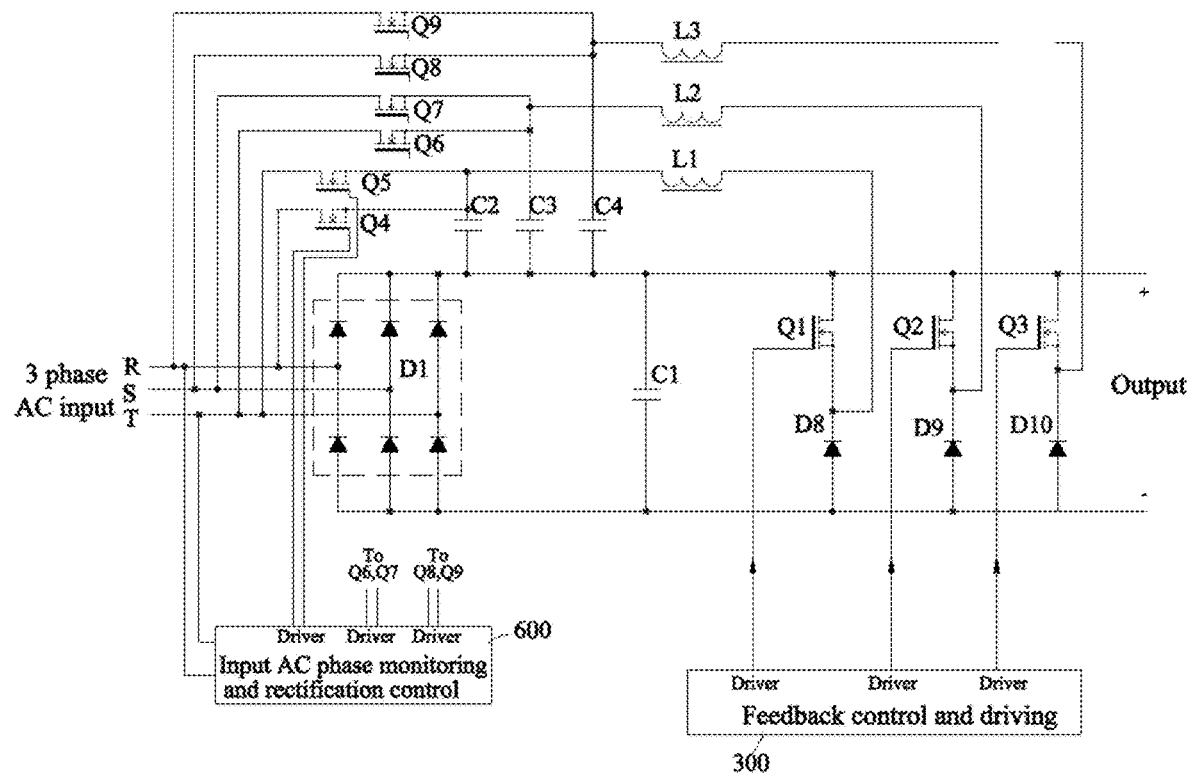
FIG. 9 is a schematic diagram of the fourth embodiment.

The fourth embodiment is constructed by replacing the second input rectification circuit in each boost converter circuit in the above first, second and third embodiments with switching components. As shown in FIG. 9, the second input rectification circuit of each boost converter circuit contains a third switching component Q4 or Q6 or Q8, a fourth switching component Q5 or Q7 or Q9 and the bridge diode D1. In the first boost converter circuit, Q4 is the third switching component and Q5 is the fourth switching component. In the second boost converter circuit, Q6 is the third switching component and Q7 is the fourth switching component. In the third boost converter circuit, Q8 is the third switching component and Q9 is the fourth switching component. The third switching components and fourth switching components are implemented as low conducting resistance switching elements like FET, whose on-state loss can be effectively reduced. In each boost converter circuit, one terminal of the third switching component and one terminal of the fourth switching component are coupled to the node between the second capacitor and the first inductor, the other terminal of the third switching component and the other terminal of the fourth switching component are respectively coupled to the two corresponding poles of the three phase AC input.

Boost converter circuits' operating principle is same as the first embodiment.

In the portion of two input rectification circuits, operating principle of the first loop to charge the first capacitor C1 is also same as that in the first embodiment.

Figure 10:
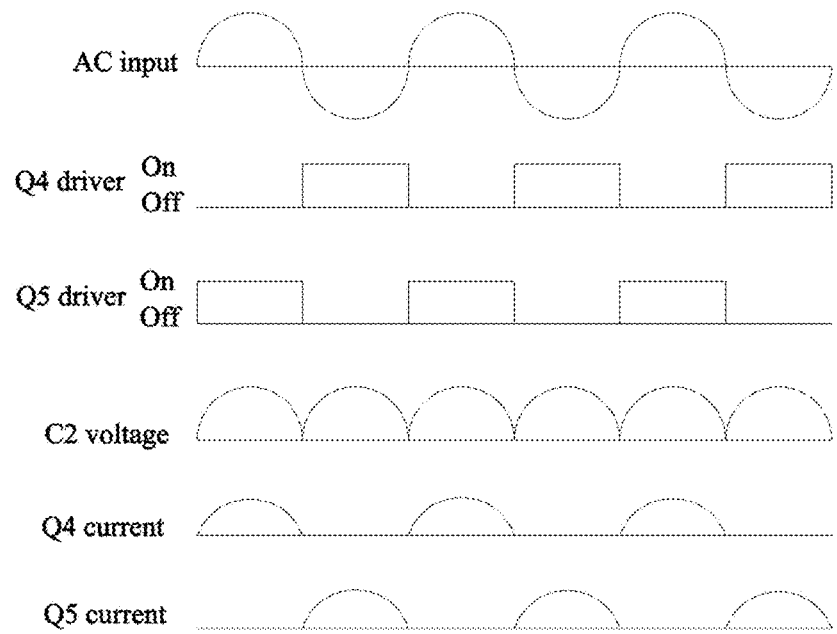
FIG. 10 is the controlling waveform of the fourth embodiment.

Take the first boost converter circuit as an example, the second loop to charge second capacitor is illustrated in FIG. 9 and explained below: Input AC phase monitoring and rectification control circuit 600 monitors input AC voltage or phase, and controls the synchronous conduction and cut-off of the third switching component Q4 and the fourth switching component Q5 according to the respective AC input voltage. Due to Q4 and Q5's continuous conducting during AC positive forward interval, no switching loss is consumed comparing to bridgeless PFC circuit, which brings advantage to this embodiment. Control dead time between Q4 and Q5 can improve lightning surge immunity to prevent input short at AC input voltage close to zero. FIG. 10 shows controlling waveform of the fourth embodiment.

While the present invention has been shown and described in connection with the embodiments, it will be apparent to those skilled in the art that modifications and variations can be made without departing from the spirit and scopes of the invention as defined by appended claims.

What is claimed is:

1. A switching mode power supply (SMPS) circuit used for three-phase AC input, comprising: a first input rectification circuit, a first capacitor, a boost feedback control and driving circuit, and at least one boost converter circuit, wherein:

the first input rectification circuit rectifies an input voltage and forms, together with the first capacitor, a first loop for charging the first capacitor;

each boost converter circuit converts one corresponding phase of the three-phase AC input, and each boost converter circuit at least includes: a second input rectification circuit, a second capacitor and a boost circuit, wherein the boost circuit includes a first inductor, a first switching component and a first output rectification circuit;

in each boost converter circuit, the second input rectification circuit rectifies the input voltage and forms, together with the second capacitor, a second loop for charging the second capacitor; when the first switching component conducts, the first inductor, the second capacitor and the first switching component form a third loop in which the second capacitor charges the first inductor; when the first switching component cuts off, the first inductor, the second capacitor, the first capacitor and the first output rectification circuit form a fourth loop in which an induced voltage on the first inductor is superimposed onto a voltage on the second capacitor to charge the first capacitor through the first output rectification circuit; the first capacitor, the second capacitor in each boost converter circuit, and the first input rectification circuit are coupled at terminals of a same polarity;

the first capacitor supplies energy to a load; and the boost feedback control and driving circuit outputs a chopping signal with a certain frequency and duty to turn on or turn off the first switching component in each boost circuit.

2. The SMPS circuit used for three-phase AC input according to claim 1, further including an input inrush current limiting circuit which is arranged in the first loop, and does not belong to any one of the second loop, the third loop and the fourth loop.

3. The SMPS circuit used for three-phase AC input according to claim 2, wherein the input inrush current limiting circuit at least comprises a resistance or any combination of resistance, inductance and capacitance.

4. The SMPS circuit used for three-phase AC input according to claim 1, further comprising an input AC phase monitoring and rectification control circuit, wherein each second input rectification circuit includes a third switching component and a fourth switching component; in each boost converter circuit, one terminal of the third switching component and one terminal of the fourth switching component are coupled to a node between the second capacitor and the first inductor; the other terminal of the third switching component and the other terminal of the fourth switching component are coupled to two poles of one corresponding phase of the three-phase AC input, respectively; the input AC phase monitoring and rectification control circuit controls a synchronous turn-on or turn-off of the third and fourth switching components according to a voltage or phase of the AC input.

5. The SMPS circuit used for three-phase AC input according to claim 1, wherein the first output rectification circuit is implemented as a second switching component; in each boost converter circuit, after a current of the fourth loop discharges a parasitic capacitor of the second switching component, the second switching component is controlled to be turned on by the boost feedback control and driving circuit in a zero voltage switching mode.

6. The SMPS circuit used for three-phase AC input according to claim 5, wherein the first inductor operates at a discontinuous mode; in each boost converter circuit, after a current in the first inductor returns to zero, a resonant current caused by a voltage on the first capacitor charging the second capacitor and first inductor, with the second switching component being turned off by the boost feedback control and driving circuit, discharges a parasitic capacitor of the first switching component, allowing the first switching component to turn on next time in a zero voltage switching mode.

7. The SMPS circuit used for three-phase AC input according to claim 6, wherein the boost feedback control and driving circuit is further configured to monitor a zero-return of the current in the first inductor; in each boost converter circuit, when the current in the first inductor is detected to have returned to zero, an instant current to discharge a parasitic capacitor of the first switching component is adjustable by controlling a time of turn-off of the second switching component, so as to control a speed and time interval of discharging of the parasitic capacitor of the first switching component, wherein during a dead time when both of the first and second switching components are turned off, the parasitic capacitor of the first switching component is effectively discharged, allowing the first switching component to turn on next time at a substantial zero voltage state.

8. The SMPS circuit used for three-phase AC input according to claim 5, wherein the boost feedback control and driving unit is further configured to dynamically adjust a dead time of complement driving signal for the first switching component and the second switching component.

9. The SMPS circuit used for three-phase AC input according to claim 1, wherein the boost feedback control and driving circuit is further configured to monitor both an instant input voltage and an output voltage of each boost converter circuit, and obtain, through logic or mathematic calculation, a maximum duty to ensure a sufficient magnetic reset of the first inductor of each boost converter circuit, so as to limit a conducting time of the corresponding first switching component.

10. The SMPS circuit used for three-phase AC input according to claim 1, wherein at least three boost converter circuits are controlled by the boost feedback control and driving circuit to operate in a synchronous or interleaved or phase-shift mode.

* * * * *